(12) United States Patent
Costas et al.

(10) Patent No.: US 6,607,424 B1
(45) Date of Patent: Aug. 19, 2003

(54) COMPOSITIONS FOR INSULATOR AND METAL CMP AND METHODS RELATING THERETO

(75) Inventors: Wesley D. Costas, Bear, DE (US); James Shen, Aloha, OR (US); Glenn C. Mandigo, Boothwyn, PA (US); Terence M. Thomas, Newark, DE (US); Craig D. Lack, Wilmington, DE (US); Ross E. Barker, II, Newark, DE (US)

(73) Assignee: Rodel Holdings, Inc., Wilmington, DE (US)

(*) Notice: Subject to any disclaimer, the term of this patent is extended or adjusted under 35 U.S.C. 154(b) by 124 days.

(21) Appl. No.: 09/643,578

(22) Filed: Aug. 22, 2000

Related U.S. Application Data

(60) Provisional application No. 60/150,443, filed on Aug. 24, 1999.

(51) Int. Cl.$^7$ ................................................ B24B 1/00
(52) U.S. Cl. ................................................ 451/41; 51/307
(58) Field of Search ........................ 51/307, 308, 309; 451/41

(56) References Cited

U.S. PATENT DOCUMENTS

| | | | | |
|---|---|---|---|---|
| 4,752,628 A | * | 6/1988 | Payne | 523/122 |
| 5,264,010 A | | 11/1993 | Brancaleoni et al. | |
| 5,352,277 A | | 10/1994 | Sasaki | |
| 5,382,272 A | | 1/1995 | Cook et al. | |
| 5,391,258 A | | 2/1995 | Brancaleoni et al. | |
| 5,476,606 A | | 12/1995 | Brancaleoni et al. | |
| 5,480,476 A | | 1/1996 | Cook et al. | |
| 5,704,987 A | * | 1/1998 | Huynh et al. | 134/26 |
| 5,738,800 A | * | 4/1998 | Hosali et al. | 216/89 |
| 5,783,489 A | | 7/1998 | Kaufman et al. | |
| 5,860,848 A | * | 1/1999 | Loncki et al. | 451/285 |
| 5,876,490 A | | 3/1999 | Ronay | |
| 5,932,486 A | | 8/1999 | Cook et al. | |
| 5,958,794 A | | 9/1999 | Bruxvoort et al. | |
| 6,030,899 A | | 2/2000 | Cook et al. | |
| 6,117,775 A | * | 9/2000 | Kondo et al. | 438/690 |
| 6,362,106 B1 | * | 3/2002 | Kaufman et al. | 216/89 |
| 6,413,288 B2 | * | 7/2002 | Yancey | 51/307 |

FOREIGN PATENT DOCUMENTS

| | | |
|---|---|---|
| EP | 874 390 A1 | 10/1998 |
| EP | 913 442 A2 | 5/1999 |
| EP | 984 049 A1 | 3/2000 |
| WO | WO00/13217 A1 | 9/2000 |

* cited by examiner

*Primary Examiner*—M. Rachuba
(74) *Attorney, Agent, or Firm*—Hilmar L. Fricke; Blake T. Biederman

(57) ABSTRACT

A composition is provided which is useful for the polishing of a semiconductor wafer substrate comprising an organic polymer having a backbone comprised of at least 16 carbon atoms, the polymer having a plurality of moieties with affinity to surface groups on the semiconductor wafer surface.

Another composition is provided which is useful for the polishing of a semiconductor wafer substrate comprising a surfactant having a carbon chain backbone comprised of at least 16 carbon atoms.

16 Claims, 2 Drawing Sheets

COMPOSITIONS FOR INSULATOR AND METAL CMP AND METHODS RELATING THERETO

This application claims the benefit of U.S. Provisional Application Ser. No. 60/150,443 filed Aug. 24, 1999 and U.S. Provisional Application filed Aug. 11, 2000.

BACKGROUND OF THE INVENTION

1. Field of the invention

The present invention relates to the polishing and planarization of integrated circuit surfaces, particularly those comprising silicon dioxide films (TEOS, thermal oxide or BPSG), low-K ILD films, silicon nitride films, metal films (lines) and the mixtures of these.

2. Discussion of Related Art

CMP is an enabling technology used in the semiconductor industry to remove/planarize various thin films from the surface of semiconductor substrates during the production of IC. Various types of abrasives have been used for CMP. The polishing pad, typically made of polymer materials, is another important part in the CMP process. Particles of silicon dioxide, metal oxide (alummina, ceria, titania and ziconia etc.) or a mixture of the like are typically used as the abrasive in CMP slurries.

Achieving IC wafer planarization with smooth, scratch-free and low defect surfaces is greatly challenged by the presence of abrasive particles and the micro-asperities of the polymer pads. A CMP slurry which is not properly formulated will generate scratches and residues on the polished surfaces. The scratches may result from the trace tracks of the particles (slurry abrasives and residue from removed materials), while the residue coating may come from the gelled slurries and the re-deposition of the removed materials (metal oxide in the case of metal CMP and silanol or silicates in the case of silicon oxide CMP.) The dense scratching texture will heavily contribute to the higher level of roughness on the wafer surfaces. It has been observed that the slurry coating and re-deposition of residue will preferentially occur in the dense pattern areas, especially small features and interconnection lines in areas where the surface energy is high and the residue can be readily accommodated.

U.S. Pat. No. 5,704,987 addresses the problem of removing residual slurry particles adhered to a wafer surface after chemical-mechanical polishing. Proposed is a two step cleaning operation. The first step uses a basic aqueous solution of a nonionic polymeric surfactant; the second step uses purified water.

U.S. Pat. No. 5,783,489 discusses the use of surfactants, stabilizers, or dispersing agents to promote stabilization of a polishing slurry including oxidizing agents against settling, flocculation and decomposition. Surfactants may be anionic, cationic, nonionic, or amphoteric. It was found that the addition of a surfactant may be useful to improve the within-wafer-non-uniformity (WTWNU) of the wafers, thereby improving the surface of the wafer and reducing wafer defects.

The present invention provides compounds that can be used in CMP slurries to prevent scratching, minimize surface roughness, and eliminate coating of gelled slurries or residue on the IC wafer surfaces. The chemical compounds listed in this patent work effectively with abrasive particles including, but not limited to, silicon dioxide, metal oxides and any other inorganic oxides, and mixtures of the like. The slurries of this invention work effectively on CMP processes for sheet wafers, pattern wafers with the films/lines of silicon dioxide (TEOS, BPSG, thermal oxide), low K polymers, silicon nitride and metals, as well as mixtures of the like.

SUMMARY OF THE INVENTION

A composition is provided which is useful for the polishing of a semiconductor wafer substrate comprising an organic polymer having a backbone comprised of at least 16 carbon atoms, the polymer having a plurality of moieties with affinity to surface groups on the semiconductor wafer surface.

Another composition is provided which is useful for the polishing of a semiconductor wafer substrate comprising a surfactant having a carbon chain backbone comprised of at least 16 carbon atoms.

Yet another polishing composition is provided for the chemical mechanical polishing of semiconductor wafers having a metal circuit comprises an aqueous composition having a pH of under 5.0 and comprises polyacrylic acid having a number average molecular weight of about 20,000–150,000, or blends of high and low number average molecular weight polyacrylic acids.

A further aspect of this invention is the method of polishing a semiconductor wafer substrate, wherein the substrate is pressed against a polishing pad, the substrate and the pad are moved relative to each other, and a polishing composition is applied to the pad during the polishing operation, the polishing composition comprising an organic polymer having a backbone comprised of at least 16 carbon atoms, the polymer having a plurality of moieties with affinity to surface groups on the semiconductor wafer surface.

Yet another aspect of this invention is the method of polishing a semiconductor wafer substrate, wherein the substrate is pressed against a polishing pad, the substrate and the pad are moved relative to each other, and a polishing composition is applied to the pad during the polishing operation, the polishing composition comprising a surfactant having a carbon chain backbone comprised of at least 16 carbon atoms.

The compositions of this invention may optionally further comprise one or more of the following: submicron abrasive particles, a dispersing agent, an oxidizing agent, and a complexing agent.

DESCRIPTION OF THE PREFERRED EMBODIMENTS

Figure 1:
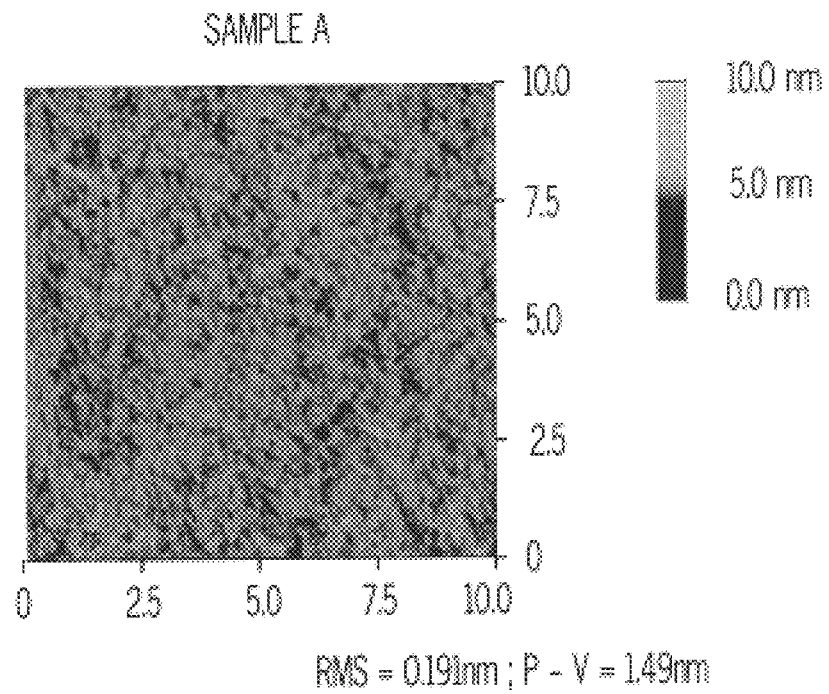
FIG. 1 contains comparative AFM photomicrographs of a substrate polished with and without polyvinylpyrrolidone, each obtained using a scan size of 10.00 μm and a scan rate of 1.001 Hz.
Figure 1:
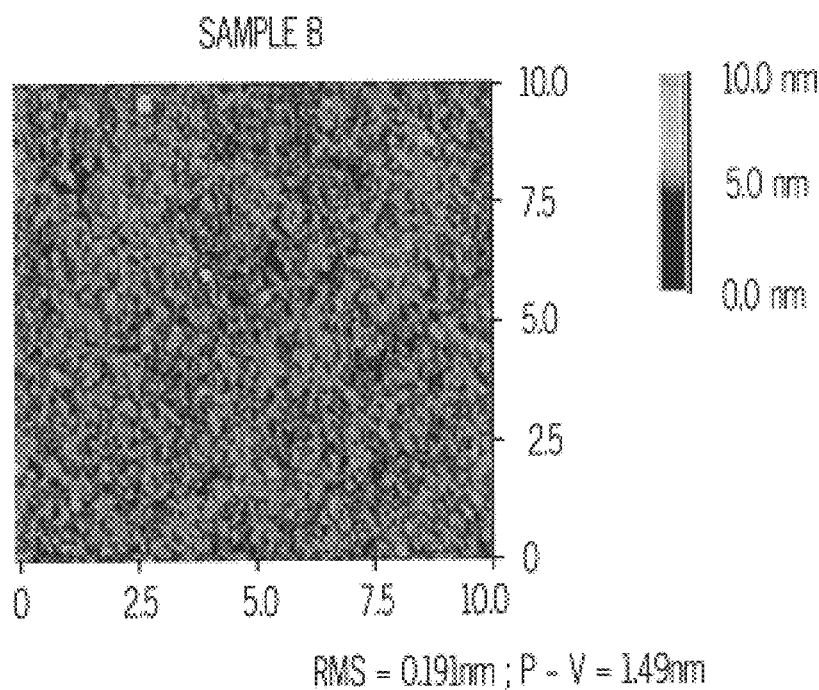
Figure 2:
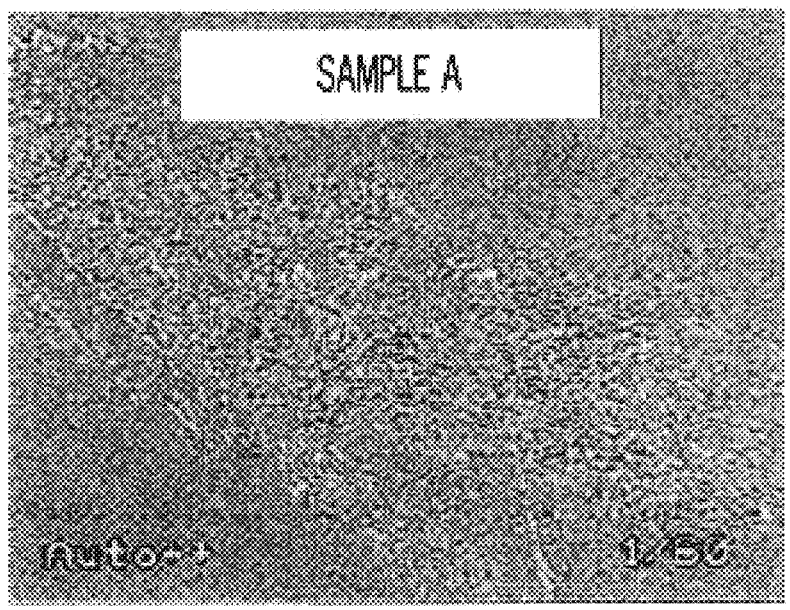
FIG. 2 contains comparative optical photomicrographs of Leica defects for a substrate polished with and without polyvinylpyrrolidone, using a magnification of 143×.
Figure 2:
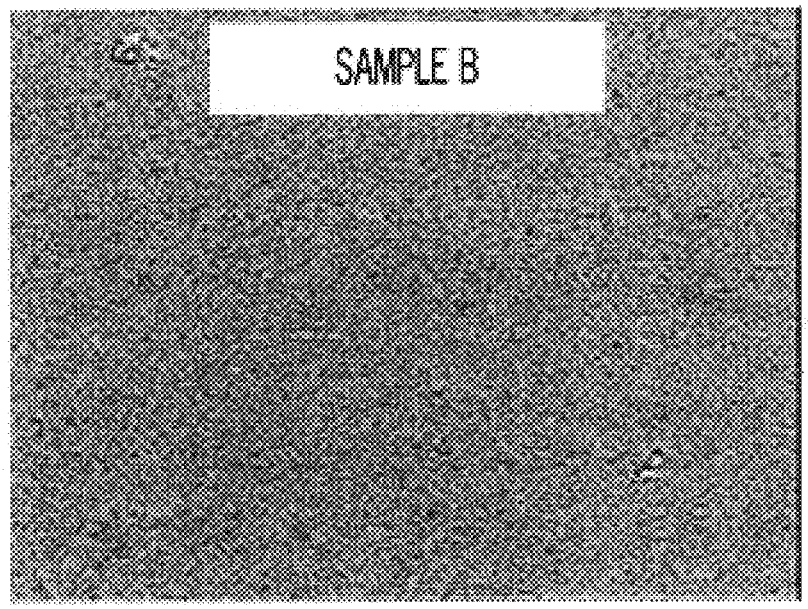

Coating of polished IC wafer surfaces by preferentially adsorbed surfactants or polymers can significantly eliminate scratching and redeposition of residue. The coating layer, however, should be weakly bonded to the wafer surfaces, and be readily swept away by abrasion during CMP process, so that the materials removal rate will not be significantly reduced. The coating layers should also be readily rinsed off by DI water, or alkaline solutions in the post-CMP cleaning processes. It has been discovered that the addition of a type of surfactant or a type of polymer into the CMP slurries can effectively serve the purposes outlined above providing the additive has a carbon chain length greater than about 16. A surfactant should have a hydrophobic end containing CxH2x+1 with x>16, or have ethylene oxide chains (OCH2CH2)n with n>8, or the mixture of both. The other end of the surfactant comprises functional hydrophilic moieties attached to the hydrophobic chain described above. These moieties have affinity to surface groups (i.e., silanol, siloxane, or hydroxylized metal films or lines) contained on wafer surfaces. These functional end groups are commonly polar moieties, such as, but not limited to, hydroxyl, ether, amine oxide, phosphine oxide, sulphoxide, carboxy, carbonyl, alkoxy, sulphonyl, sulphate and phosphonyl. The polymer may be a high molecular weight organic polymer containing a carbon backbone with functional moieties extending from the backbone. The functional moieties interact strongly with the wafer surface so as to provide a protective layer. The mechanism of interaction between the functional moieties and the hydroxyl surface is most likely, though not limited to, that observed in the hydrogen bonding of polar species (such as the interaction of hydroxyl groups). The polymer compound is further defined as a high molecular weight organic material having a degree of polymerization of at least 5 (i.e., 5 repeating monomeric units), more preferably more than 10, and most preferably greater than 50. The carbon chain backbone of the polymer should have a carbon chain length of about 16 or greater. The polymer compound comprises a plurality of moieties having affinity to surface groups (i.e., silanol, siloxane, hydroxylized metal films or lines etc.) contained on wafer surfaces. These groups are commonly polar moieties, such as, but not limited to, hydroxyl, ether, amine oxide, phosphine oxide, sulphoxide, carboxy, carbonyl, alkoxy, sulphonyl, sulphate and phosphonyl. The ratio of the number of the wafer surface affinity functional groups to the number of carbons in the backbone chain shall be between 1:1 to 1:200, preferably from 1:1 to 50, and most preferably from 1:1 to 1:10. It is also observed that block co-polymers of the above defined polymers have the same functions for the above mentioned applications. Examples of this type of molecule include, but not limited to, poly-vinyl alcohol, poly-vinylpyrrolidone, poly-methyl methacrylate, poly-formaldehyde, poly-ethylene oxide, poly-ethylene glycol, poly-methacrylic acid, polyacrylic acid and the mixture of the like.

The slurries of this invention may optionally comprise a dispersant. Aqueous CMP slurries contain submicron abrasive particles. The size of these particles is important to the performance of the slurry as well as to the resultant surface quality. If the abrasive particles agglomerate, the polishing removal rates may change and the surface quality may deteriorate. Dispersants can be included in the slurry formulation to prevent this agglomeration of abrasive particles. Dispersants can be anionic, cationic, or nonionic. The selection of the proper dispersant depends on many factors including the surface characteristics of the abrasive particles and the ionic nature of the slurry formulation. Some examples of ionic surfactants include sodium lauryl sulfate, cetyl-trimethyl ammonium bromide. Amino alcohols are also used as dispersants in slurries for CMP.

An oxidizing agent may also be present in the compositions of the present invention. Examples of common oxidizing agents are nitrates, iodates, chlorates, perchlorates, chlorites, sulphates, persulphates, peroxides, ozonated water, and oxygenated water. Oxidizing agents can be used in slurries for CMP at concentrations of about 0.01% to about 7% by weight. Generally they are used at concentrations of about 1% to about 7% by weight. An iodate is a preferred oxidizing agent.

Any metal oxide or other polishing abrasive (such as alumina, ceria, zirconia, silica, titania, barium carbonate, or diamond) may be used in the slurries of this invention.

One particularly useful polishing composition of this invention for the chemical mechanical polishing of semiconductor wafers having a metal and in particular a copper metal circuit is a polyacrylic acid composition that comprises an aqueous composition having a pH of under 5.0 and comprises polyacrylic acid having a number average molecular weight of about 20,000–150,000, or blends of high and low number average molecular weight polyacrylic acids, up to 3.0% by weight of abrasive particles, 1–15% by weight of an oxidizer, preferably hydrogen peroxide, 50–5,000 ppm (parts per million by weight) of an inhibitor, and up to 3.0% by weight of a complexing agent, preferably, malic acid.

A preferred polyacrylic acid polishing composition contains a blend of two or more polyacrylic polymers of a low molecular weight polyacrylic acid polymer having a number average molecular weight of about 20,000–100,000 and a high number average molecular weight polymer of about 200,000–1,500,000. The weight ratio of low molecular weight polymer to high molecular weight polymer is about 10:1 to 1:10.

This polyacrylic acid polishing composition is an aqueous composition having a pH of under 5.0 and preferably about 2.8–4.2, and more preferably, 2.8–3.8. It has been found that a pH of 5.0 and above results in significant reduction in polishing of the copper in the semiconductor substrate.

This polyacrylic acid composition contains about 0.05–1.0% by weight, based on the weight of the composition, of polyacrylic acid or a blend or mixture of polyacrylic acids at least one having a relatively high number average molecular weight and the other or others having a relatively low number average molecular weight.

The number average molecular weight of the polyacrylic acid is determined by GPC (gel permeation chromatography).

The polyacrylic acid used in the polyacrylic acid composition has a number average molecular weight of about 20,000–150,000, preferably 25,000–75,000 and more preferably 25,000–40,000. If a blend or mixture of two polyacrylic acids is used, a low number average molecular weight polymer having a molecular weight of about 20,000–100,000 and preferably 20,000–40,000 is used. The high number average polyacrylic acid has a molecular weight of about 200,000–1,500,000, preferably, 150,000–300,000. The weight ratio of the low molecular weight polyacrylic acid polymer to the high molecular weight polymer is about 10:1 to 1:10, preferably 4:1 to 1:4, and more preferably 2:1 to 1:2.

One particularly preferred blend comprises a polyacrylic polymer having a low number average molecular weight of about 30,000 and a polyacrylic polymer having a high number average molecular weight of about 250,000 in a 1:1 weight ratio.

It is possible to use additional low molecular weight polyacrylic acids in the blend such as polyacrylic acids having a number average molecular weight of 1,000–5,000.

It is possible to use very high molecular weight polyacrylic acid polymers (molecular weight over 1,500,000) or crosslinked polyacrylic acid polymers in these polishing compositions as an additional additive, by properly adjusting polishing conditions and other components of the composition. Also, it may be possible to use these high molecular weight or crosslinked polyacrylic acids in place of the aforementioned single polyacrylic acid or the blend of polyacrylic acids.

It is possible to use polymers of the acrylic group such as copolymers of acrylic acid, polymethacrylic acid, copolymers of methacrylic acid, polyacrylamides, acrylamide copolymers, polymethacrylamides, methacrylamide copolymers and a variety of other copolymers of the above and obtain an acceptable polishing composition.

Also, it is possible to form polyacrylic acid polymers that are biodegradeable, photodegradeable, or degradeable by other means that can be used in this invention for the polishing composition. An example of such a composition is a biodegradeable polyacrylic acid containing segments of poly(acrylate co methyl 2-cyanoacrylate).

The polyacrylic acid polishing composition can contain up to 3.0% by weight of abrasive particles described above Preferably, the composition does not contain such particles.

The polyacrylic acid polishing composition contains about 1–15% by weight, preferably, 5–10% by weight, of an oxidizing agent such as hydrogen peroxide, iodates such as potassium iodate, nitrates such as cesium nitrate, barium nitrate, ammonium nitrate, mixtures of ammonium nitrate and cesium nitrate, carbonates such as ammonium carbonate, persulfates such as ammonium and sodium sulfate and perchlorates. Hydrogen peroxide is preferred in amounts of about 9% by weight.

The polyacrylic acid composition contains up to 3.0% and preferably, 0.1–1.0% of a complexing agent such as carboxylic acids containing two or more carboxylate groups with hydroxy groups as disclosed in Brancaleoni et al U.S. Pat. No. 5,391,258 issued Feb. 21, 1995 which is hereby incorporated by reference. Typical complexing agents include straight chain mono-and dicarboxylic acids and their salts such malic acid and malates, tartaric acid and tartarates, gluconic acid and gluconates, citric acid and citrates, malonic acid and malonates, formic acid and formates, lactic acid and lactates. Polyhydroxybenzoic acid and acid salts, phthalic acid and acid salts also can be used.

The polyacrylic acid composition also contains about 50–5,000 ppm (parts per million by weight) of an inhibitor such as BTA (benzotriazole) and TTA (tolyltriazole) or mixtures thereof that are preferred. Other inhibitors that can be used are 1-hydroxybenzotriazole, N-(1H-benzotriazole-1-ylmethyl)formamide, 3,5-dimethylpyrazole, indazole, 4-bromopyrazole, 3-amino-5-phenylpyrazole, 3-anino-4-pyrazolecarbonitrile, 1-methyimidazole, Indolin QTS and the like.

The polyacrylic acid composition may contain pH buffers such as amines, and may contain surfactants, deflocculants, viscosity modifiers, wetting agents, cleaning agents and the like.

The following are typical polishing pads that can be used with the novel polishing composition and with the polyacrylic acid composition of this invention to polish semiconductors: metals pad described in Roberts et al U.S. Pat. No. 6,022,268 issued Feb. 8, 2000, pads containing polishing particles described in Cook et al U.S. Pat. No. 6,022,264 issued Feb. 8, 2000, pads described in Cook et al U.S. Pat. No. 5,489,233 issued Feb. 6, 1996, polymer impregnated fiber matrices typified by pads sold by Rodel, Inc. under the trade name SUBA, pads of a polymer sheet containing void spaces effected by in situ production or incorporation of hollow filler materials (typically pads sold by Rodel, Inc. under the trade names POLITEX AND IC1010), pads of polymer sheets containing solid particles added as filers, which may optionally contain void spaces, effected either by in situ production or by incorporation of hollow filler materials (typically pads sold by Rodel Inc. under the trade names MH), and composite pads consisting of multiple layers of materials whose outer substrate contacting surface consists of a pad selected from one of the above.

In the examples presented below, we demonstrate the reduction of wafer surface tension resulting from the adsorption of the above mentioned additives in the slurries. Examples of the surface roughness improvement and prevention of slurry/residue redeposit are also given. All parts and percentages are on a weight basis and molecular weights are determined by gel permeation chromatography unless otherwise indicated.

EXAMPLE 1

Wafer Surface Tension Reduction by Additives in Slurries

A Cruise K-12 Tensiometer was used to determine surface tension. For surface tension measurements, the density of the slurry is measured and recorded. Wafers, cut into square sections and cleaned via torch method, are measured to determine their thickness and width, and then placed in a clean area for future use. The instrument is turned on and the balance is zeroed. Wafers, are attached to the balance via a clasp holder, and 80 ml of slurry is added to the appropriate sample container. During experimentation, the sample container will rise until the wafer is immersed in the slurry to a given depth. The data generated by the instrument is calculated based on weight differences experienced by the wafer as it penetrates the surface of the slurry. To determine surface tension, the surface tension software is opened, the plate method is selected, and sample parameters are entered (e.g. thickness, and width of the wafer, density of the slurry, and immersion depth). The instrument is started and surface tension is calculated.

As seen in Table 1, the addition of PVP (Polyvinylpyrrolidone) into the slurry reduces the surface tension on both TEOS and BPSG wafer surfaces, indicating that the PVP adsorbed on the surface and formed a protection layer along the surfaces.

TABLE 1

Effect of additives on surface tension of wafers

| Solution | Surface Tension on TEOS (Dyne/cm) | Surface Tension on BPSG (dyne/cm) |
| --- | --- | --- |
| D. I. Water at 25 C. | 54.3 | 68 |
| Sample A without PVP | 54.3 | 56 |
| Sample B: Sample A + 0.2 wt % PVP | 41.5 | 44 |

EXAMPLE 2

Wafer Surface Roughness Reduction

AFM images were taken of wafers from samples A & B. A Digital Instruments Dimension 5000 AFM was used to image the wafers. A 10×10 μm scan size was chosen. RMS (root mean square) roughness was measured as well as P-V (peak to valley) for all surface points. Center and edge points on the wafer were sampled.

EXAMPLE 3

Prevention of Slurry/Residue Re-deposition

To illustrate the effects of PVP on extreme surface roughening and slurry residue re-deposition, an underconditioned OXP-3000 was used in a slower table and platen speed process. Sample A without PVP was used as the polishing slurry under the given conditions. This was followed by Sample B with PVP. TEOS sheet wafers were polished, buffed with DI Water, cleaned with an ammonium hydroxide solution on an OnTrak DSS-200 scrubber, and reviewed under a Leica defect review optical microscope. The Leica was set at 5×objective, which translates to a 143×total screen magnification. Normarski prism mode was used to enhance contrast.

EXAMPLE 4

Prevention of Slurry/Residue Re-deposition

Several polymers and surfactants were used in this Example in which slurry/residue re-deposition was measured as in Example 3. It was surprisingly found that the polymers and surfactants which prevent the re-deposition of slurry/residue must have a carbon chain length of at least about 16. We cannot generally say that all polymers and surfactants containing the functional moieties mentioned above will be effective. The molecules must be large enough to form a film thick enough to be a preventative to the e slurry/residue re-deposition.

For the following slurry/redeposition tests, TEOS wafers were polished on a Strsbaugh 6DS-SP polisher under the following conditions. ILD1300 polishing slurry available from Rodel, Inc., Newark, Del. was used with 0.2% by weight of the surfactant or polymer additive.

TABLE 2

Effect of carbon chain length.

| Additive | Manufacturer | Type | Approximate Carbon Chain Length | Slurry/residue redeposition/ coating on wafer |
|---|---|---|---|---|
| Polyvinyl-pyrrolidone (Mw~10,000) | Sigma/Aldrich | Polymer | 180 | No |
| Polyvinyl-alcohol (Mw~40,000) | Air Products | Polymer | 1600+ | No |
| Amphoterge KJ-2 | Lonza | Amphoteric Surfactant | 9–15 | Yes |
| BRIJ-58 | ICI Surfactants | Nonionic Surfactant | 56 | No |
| Zonyl FSP | Dupont | Anionic Surfactant | 4–16 | Yes |

Table 2 shows that the carbon chain length must be about 16 or greater for the additive to be effective in preventing slurry/residue redeposition. It has also been found that suitable additives are particularly effective when used with a polishing pad with a relatively hard surface such as an OXP3000 pad available from Rodel, Inc., Newark, Del.

EXAMPLE 5

Polyacrylic Acid Polishing Compositions

An aqueous polishing Composition 1 was prepared by blending together the following constituents: 0.22 parts malic acid, 3000 ppm (part per million) benzotriazole, 9.0 parts hydrogen peroxide with water to provide 100 parts of the composition and the pH was adjusted to 3.1. Then 0.09 parts polyacrylic acid having a number average molecular weight of 250,000 and 0.09 parts polyacrylic acid having a number average molecular weight of 30,000 were added.

A Mira polishing machine was used under the following conditions: 5 psi. down force, 100 rpm platen speed and 90 rpm head speed for 40 seconds; the second stage of polishing was 5 psi down force, 100 rpm platen speed, 25 rpm head speed for 40 seconds; and the third stage of polishing was 2 psi down force, 100 rpm platen speed and 90 rpm head speed for 220 seconds. The pad used was a Metals 26 pad made by Rodel Inc. and described in U.S. Pat. No. 6,022,268. The pad was pre-conditioned for 30 minutes with a 100 grit diamond disk (manufactured by Abrasives Technology, Inc.) and conditioned for 20 seconds between polishing of wafers.

The test wafers polished were silicon wafers having a silicon dioxide layer with copper trenches or lines each having a width of 10 um, 25 um and 100 um and a thin copper layer was deposited on top of the wafer.

After polishing the dishing of each of the lines was measured at the center, middle and edge of the line and an average was determined. Because the polishing composition has high copper to barrier selectivity, the copper removal essentially stops when the barrier is reached. Therefore the dishing values reported in the following Table 3 include the barrier thickness. The results as shown below in Table 3 are considered acceptable.

An aqueous polishing Composition 2 was prepared which was identical to Composition 1 except the following mixture of polyacrylic acids was used: 0.09% Polyacrylic Acid MW 1,250,00+0.09% Polyacrylic Acid MW 30,000. Polishing was carried out as above and the results are acceptable and shown in Table 3 below.

An aqueous polishing Composition 3 was prepared which was identical to Composition 1 except the following mixture of polyacrylic acids was used: 0.09% Polyacrylic Acid MW 750,000+0.09% Polyacrylic Acid MW 30,000. Polishing was carried out as above and the results are acceptable and shown in Table 3 below.

An aqueous polishing Composition 4 was prepared which was identical to Composition 1 except the following polyacrylic acid was used: 0.18% Polyacrylic Acid MW 30,000. Polishing was carried out as above and the results are acceptable and shown in Table 3 below.

An aqueous polishing Composition 5 was prepared identical to Composition 1 except all of the benzotriazole was replaced with tolyltriazole. Polishing was carried out under the following conditions: 5 psi. down force, 100 rpm platen speed and 90 rpm head speed for 60 seconds; the second stage of polishing was 5 psi down force, 100 rpm platen speed, 25 rpm head speed for 60 seconds; and the third stage of polishing was 2 psi down force, 100 rpm platen speed and 90 rpm head speed for 115 seconds. The average polishing results, expressed in angstroms, are acceptable and shown in Table 3 below.

TABLE 3

| 10 um line | 25 um line | 100 um line |
|---|---|---|
| Composition I (0.09% 250,000 MW Polyacrylic Acid + 0.09% 30,000 MW Polyacrylic Acid) | | |
| Ave. 391 | Ave. 493 | Ave. 943 |
| Composition 2 (0.09% 1,250,000 MW Polyacrylic Acid + 0.09% 30,000 MW Polyacrylic Acid) | | |
| Ave. 316 | Ave. 383 | Ave. 637 |
| Composition 3 (0.09% 750,000 MW Polyacrylic Acid + 0.09% 30,000 MW Polyacrylic Acid) | | |
| Ave. 416 | Ave. 441 | Ave. 940 |

TABLE 3-continued

| 10 um line | 25 um line | 100 um line |
| --- | --- | --- |
| \multicolumn{3}{c}{Composition 4 (0.18% 30,000 MW Polyacrylic Acid)} | | |
| Ave. 469 | Ave. 715 | Ave. 1007 |
| \multicolumn{3}{c}{Composition 5 (Identical to Composition 1 except tolyltriazole was substituted for benzotriazole)} | | |
| Ave. 354 | Ave. 503 | Ave. 757 |

EXAMPLE 8
COMPARATIVE EXAMPLE

The following polishing compositions containing polyacrylic acid illustrate compositions that do not provide adequate polishing results:

Composition 6

The composition is identical to Composition 1 except that 0.18% polyacrylic acid having a number average molecular weight of 1,800 was substituted for the polyacrylic acid blend used in Composition 1. Polishing was done in an identical manner as used with Composition 1 except the third stage of polishing was continued for 500 seconds. Polishing was inadequate since there was no removal of copper from the wafer.

Composition 7

The composition is identical to Composition 1 except that 0.18% polyacrylic acid having a number average molecular weight of 250,000 was substituted for the polyacrylic acid blend used in Composition 1. Polishing was done in an identical manner as used with Composition 1.

The results were as follows: 10 um–725, 25 um–959, 100 um–1581. The dishing value for the 100 um line is considered unacceptable.

Composition 8

The composition is identical to Composition 1 except that the pH was adjusted to 5.5. Polishing was done in an identical manner as used with Composition 1. Polishing was inadequate since there was no removal of copper from the wafer.

What is claimed is:

1. An aqueous polishing mixture for chemical mechanical polishing of semiconductor substrates, the mixture having a pH under 5.0 that comprises a blend of at least two polyacrylic acids, wherein a first polyacrylic acid has a low number average molecular weight of 20,000–100,000 and a second polyacrylic acid has a high number average molecular weight of 200,000–1,500,000, wherein the weight ratio of the low number average molecular weight polyacrylic acid to the high number average molecular weight polyacrylic acid is 10:1 to 1:10.

2. The aqueous polishing mixture of claim 1 wherein the mixture contains abrasive particles.

3. The aqueous polishing mixture of claim 1 wherein the mixture contains an oxidizing agent.

4. The aqueous polishing mixture of claim 1 wherein the mixture contains an inhibitor.

5. The aqueous polishing mixture of claim 1 wherein the mixture contains a complexing agent.

6. The aqueous polishing mixture of claim 1 wherein the mixture contains abrasive particles, oxidizing agent, inhibitor and complexing agent.

7. The aqueous polishing mixture of claim 6 wherein the first polyacrylic acid has a low number average molecular weight of 20,000–40,000, the second polyacrylic acid has a high number average molecular weight of 200,000–300,000 and the weight ratio of the low number average molecular weight polyacrylic acid to the high number average molecular weight polyacrylic acid is 4:1 to 1:4.

8. The aqueous polishing mixture of claim 6 wherein the pH is 2.8 to 4.2, the first polyacrylic acid has a low number average molecular weight of 20,000–40,000, the second polyacrylic acid has a high number average molecular weight of 200,000–300,000, the weight ratio of the low number average molecular weight polyacrylic acid to the high number average molecular weight polyacrylic acid is 4:1 to 1:4, the oxidizing agent consists of hydrogen peroxide, the inhibitor is from the group of benzotriazole, tolyltriazole or any mixtures thereof and the complexing agent is a carboxylic acid.

9. A method of polishing a surface of a semiconductor wafer comprising the steps of:

(a) providing a polishing pad having a polishing surface;

(b) holding said wafer in a carrier such that the surface of the wafer is in contact with the polishing surface;

(c) moving said carrier to provide both pressure on the surface of the wafer and relative lateral motion between the surface of the wafer and the polishing surface; and (d) providing the aqueous polishing mixture of claim 1 at an interface between the surface of the wafer and the polishing surface.

10. An aqueous polishing mixture for chemical mechanical polishing of semiconductor substrates, the mixture having a pH under 5.0 that comprises a blend of at least two polyacrylic acids, wherein a first polyacrylic acid has a low number average molecular weight of 20,000–100,000 and a second polyacrylic acid has a high number average molecular weight of 200,000–1,500,000, wherein the weight ratio of the low number average molecular weight polyacrylic acid to the high number average molecular weight polyacrylic acid is 10:1 to 1:10, up to 3.0% by weight abrasive particles, 1–15% by weight oxidizing agent, 50–5000 parts per million by weight of an inhibitor, and up to 3.0% by weight complexing agent.

11. The aqueous polishing mixture of claim 10 wherein the first polyacrylic acid has a low number average molecular weight of 20,000–40,000, the second polyacrylic acid has a high number average molecular weight of 200,000–300,000 and the weight ratio of the low number average molecular weight polyacrylic acid to the high number average molecular weight polyacrylic acid is 4:1 to 1:4.

12. The aqueous polishing mixture of claim 10 wherein the oxidizing agent consists of hydrogen peroxide.

13. The aqueous polishing mixture of claim 10 wherein the inhibitor is from the group of benzotriazole, tolyltriazole or mixtures thereof.

14. The aqueous polishing mixture of claim 10 wherein the complexing agent is a carboxylic acid.

15. The aqueous polishing mixture of claim 10 wherein the pH is 2.8 to 4.2, the first polyacrylic acid has a low number average molecular weight of 20,000–40,000, the second polyacrylic acid has a high number average molecular weight of 200,000–300,000, the weight ratio of the low number average molecular weight polyacrylic acid to the high number average molecular weight polyacrylic acid is 4:1 to 1:4, the oxidizing agent consists of hydrogen peroxide, the inhibitor is from the group of benzotriazole, tolyltriazole or any mixtures thereof and the complexing agent is a carboxylic acid.

16. A method of polishing a surface of a semiconductor wafer comprising the steps of:

(a) providing a polishing pad having a polishing surface;

(b) holding said wafer in a carrier such that the surface of the wafer is in contact with the polishing surface;

(c) moving said carrier to provide both pressure on the surface of the wafer and relative lateral motion between the surface of the wafer and the polishing surface; and (d) providing the aqueous polishing mixture of claim 10 at an interface between the surface of the wafer and the polishing surface.

* * * * *